United States Patent
Schaible et al.

(10) Patent No.: US 11,555,555 B2
(45) Date of Patent: Jan. 17, 2023

(54) SAFETY VALVE

(71) Applicant: HOERBIGER FLOW CONTROL GMBH, Altenstadt (DE)

(72) Inventors: Jochen Schaible, Altensteig (DE); Daniel Haller, Stuttgart (DE); Sebastian Neiss, Stuttgart (DE)

(73) Assignee: HOERBIGER FLOW CONTROL GMBH, Altenstadt (DE)

( * ) Notice: Subject to any disclaimer, the term of this patent is extended or adjusted under 35 U.S.C. 154(b) by 27 days.

(21) Appl. No.: 17/119,306

(22) Filed: Dec. 11, 2020

(65) Prior Publication Data

US 2021/0095777 A1  Apr. 1, 2021

Related U.S. Application Data

(63) Continuation of application No. PCT/EP2019/064760, filed on Jun. 6, 2019.

(51) Int. Cl.
*F16K 37/00* (2006.01)
*F16K 31/00* (2006.01)
(Continued)

(52) U.S. Cl.
CPC .......... *F16K 31/006* (2013.01); *F15B 13/043* (2013.01); *F15B 19/00* (2013.01);
(Continued)

(58) Field of Classification Search
CPC .... F16K 31/006; F16K 31/128; F16K 37/083; H01L 41/042; H01L 41/044;
(Continued)

(56) References Cited

U.S. PATENT DOCUMENTS 4,093,883 A * 6/1978 Yamamoto ............ H01L 41/094
                                                         310/317
4,395,651 A * 7/1983 Yamamoto ............ H04M 3/301
                                                         310/317
(Continued)

FOREIGN PATENT DOCUMENTS

DE    102016213228 A1   1/2018
WO      98/02685 A1     1/1998
(Continued)

OTHER PUBLICATIONS

International Search Report issued for corresponding International Patent Application No. PCT/EP2019/064760 dated Aug. 26, 2019.
(Continued)

*Primary Examiner* — Matthew W Jellett
(74) *Attorney, Agent, or Firm* — Myers Wolin, LLC

(57) ABSTRACT

A safety valve is provided with an electronic control unit for generating a control voltage. An electro-fluidic preliminary stage has a piezo bending actuator which can be actuated between a working position and a safety position by the control voltage and influences the flow of a secondary control fluid flow depending on its position. A fluid-mechanical main stage has an influencing device for influencing the flow of a primary working fluid flow. The influencing device can be actuated by means of the secondary control fluid flow which flows into a control chamber of the main stage. The control unit caries out a test of the preliminary stage repeatedly in an iterative manner after the expiration of a specified time interval. As part of the functionality test, the position of the piezo bending actuator is changed slightly by varying the control voltage.

15 Claims, 3 Drawing Sheets

(51) Int. Cl.
*F15B 13/043* (2006.01)
*F15B 19/00* (2006.01)
*F16K 31/124* (2006.01)
*H01L 41/04* (2006.01)
*H01L 41/09* (2006.01)

(52) U.S. Cl.
CPC ........ *F16K 31/124* (2013.01); *F16K 37/0083* (2013.01); *H01L 41/042* (2013.01); *H01L 41/096* (2013.01); *F15B 2211/855* (2013.01)

(58) Field of Classification Search
CPC . H01L 41/094; H01L 41/096; H01L 41/0933; H01L 41/0926; F15B 13/043; F15B 13/0431; F15B 13/0438
See application file for complete search history.

(56) References Cited

U.S. PATENT DOCUMENTS

| | | | | |
|---|---|---|---|---|
| 4,868,447 A * | 9/1989 | Lee | ...................... | H01L 41/0825 310/365 |
| 5,382,864 A * | 1/1995 | Morikawa | ............. | H01L 41/094 310/332 |
| 6,487,505 B1 * | 11/2002 | Mock | ...................... | G01R 29/22 702/33 |
| 6,820,474 B2 * | 11/2004 | Rueger | ............... | F02D 41/2096 73/114.51 |
| 6,820,495 B2 * | 11/2004 | Wallis | .................... | H02N 2/043 348/E5.09 |
| 7,737,608 B2 * | 6/2010 | Rugged | ................. | H01L 41/094 310/330 |
| 8,556,227 B2 * | 10/2013 | Buestgens | ............. | H01L 41/053 310/326 |
| 8,922,096 B2 * | 12/2014 | Beck | ...................... | H02N 2/062 310/332 |
| 9,372,487 B2 * | 6/2016 | Haller | ...................... | F16K 11/14 |
| 2007/0018534 A1 * | 1/2007 | Sciortino | ................. | H02N 2/06 310/316.01 |
| 2013/0026021 A1 * | 1/2013 | Hori | ...................... | H01L 41/318 29/25.35 |

FOREIGN PATENT DOCUMENTS

| | | | |
|---|---|---|---|
| WO | 9802685 | A1 | 1/1998 |
| WO | 01/59346 | A1 | 8/2001 |
| WO | 0159346 | A1 | 8/2001 |
| WO | 2008/000459 | A1 | 1/2008 |
| WO | 2008/005967 | A2 | 1/2008 |
| WO | 2008000459 | A1 | 1/2008 |
| WO | 2008005967 | A2 | 1/2008 |
| WO | 2016/149590 | A1 | 9/2016 |
| WO | 2016149590 | A1 | 9/2016 |
| WO | 2017/178272 | A1 | 10/2017 |
| WO | 2017178272 | A1 | 10/2017 |

OTHER PUBLICATIONS

International Preliminary Report on Patentability issued by The International Bureau of WIPO for corresponding International Patent Application No. PCT/EP2019/064760, dated Dec. 15, 2020, with an English translation.
International Search Report issued by the European Patent Office for corresponding International Patent Application No. PCT/EP2019/064760, dated Aug. 26, 2019.

* cited by examiner

SAFETY VALVE

CROSS REFERENCE TO RELATED APPLICATIONS

This application is a continuation under 35 U.S.C. § 120 of International Application PCT/EP2019/064760, filed Jun. 6, 2019, which claims priority to German Applications Nos. 10 2018 113 846.6, filed Jun. 11, 2018 and 20 2018 103 257.7, filed Jun. 11, 2018, the contents of each of which are incorporated by reference herein.

FIELD OF THE INVENTION

The present invention relates to a safety valve with an electronic control unit for generation of a control voltage, with an electrofluidic pilot stage, which has a piezo bending transducer that can be actuated between a working and a safe position by means of the control voltage, wherein the piezo bending transducer influences the flow of a secondary control fluid flow as a function of position, and with a fluid-mechanical main stage having an influencing device for influencing the flow of a primary working-fluid flow, wherein the influencing device can be actuated by means of the secondary control fluid flow discharging into a control chamber of the main stage.

BACKGROUND

Such two-stage safety valves are sufficiently known from the prior art. They are suitable in particular for especially efficient and precise actuation of fluidic switching, control and regulating devices, and in particular they may be of modular design. In this context, it has proved particularly useful to split the fluidic media flow into a secondary control fluid flow responsible for actuating the main stage as well as a primary working fluid flow. One influencing device (valve) each is associated with each of these fluid or media flows. In a generic safety valve underlying the present invention, the influencing device of the pilot stage is formed by a piezo bending transducer, which controls—directly or indirectly as an actuator for a separate valve element—the secondary control fluid flow in the direction of the control chamber of the downstream main stage. The influencing device of the main stage is advantageously a fluidically actuated valve element, with which the flow of a primary working fluid flow is appropriately controlled.

These two influencing devices differ first of all with respect to the type of actuating energy respectively delivered to them, in that the influencing device of the pilot stage is actuated electrically and the influencing device of the main stage is actuated fluidically (by the secondary control fluid).

By suitable choice of the energy transmission ratio between pilot stage and main stage, it is possible to influence a high-energy primary working fluid flow by means of a clearly lower-energy electrical control signal (control voltage). The necessary energy difference for actuation of the influencing device of the main stage is applied appropriately to the control chamber of the main stage by the pressure medium of the secondary fluid flow—depending on whether the switched state of the piezo bending transducer of the pilot stage is conducting or blocked.

A particular advantage of systems fluidically pilot-controlled in such a manner therefore lies in that the electrofluidic interface consisting of control unit and pilot stage needs to supply exclusively the limited electrical actuation energy for influencing the secondary control fluid flow, regardless of the actual energy demand of the main stage for influencing the primary working fluid flow.

Such an electrofluidic interface may be based inherently on the most diverse electromechanical transducer principles (e.g. electromechanical, magnetostrictive, electrothermal, electrorheological, capacitive, piezoelectric, etc.). For industrial use, especially electromagnetic and piezoelectric actuator mechanisms have proved useful heretofore for the pilot stage. With regard to energy efficiency, the latter have proved to be particularly advantageous, and so the present invention is based thereon.

Especially so-called piezo bending transducers with strip-like or plate-like piezoelectrically active material, which is disposed in frictionally bonded manner on a flat-structured piezoelectrically inactive carrier layer of low compressibility, have proved useful as piezoelectric actuators in fields of use that demand large actuation paths as well as the provision of a high minimum actuator force. The geometric change induced—and reversible—in the piezoelectrically active material by electrical excitation thereof leads, in interaction with the carrier layer of low compressibility joined in frictionally bonded manner, to geometric bowing of the piezo bending transducer, which is thus able, by application of a control voltage, to change from a rest position (typically representing the safety position) to a deflected position (typically representing the working position). For optimum power utilization, flat piezo bending transducers usually have elongated and narrow construction. The release of force takes place typically along the long direction of the piezo bending transducer, wherein its transverse dimension of short extent supports the buildup of force.

Piezoelectric materials are subject to physically narrow limits with respect to their ability to change volume/shape. Typically, elongations smaller than $\frac{1}{10{,}000}$ of the dimension at rest can be induced under the given conditions in piezoelectrically active high-performance materials. This necessitates an extreme level of manufacturing precision during the manufacture of piezo bending transducers. Even small defects in the crystal structure of the piezoelectrically active material and/or of the geometric dimension or in the layer structure of the piezo bending transducer may lead to the situation that corresponding bending transducers are not suitable with the necessary reliability for (continuous) use in safety-critical applications. Moreover, since piezoelectric materials have relatively high material costs, appropriately careful handling of the materials being used is already demanded for economic reasons.

Against this background, it is explained in other respects that piezoelectric mass-produced products must generally manage with limited power reserves, meaning that especially piezo bending transducers in generic safety valves often move at the edge of the power limits feasible in manufacturing technology.

Heretofore, two strategies have proved to be particularly promising as regards ensuring the needed product properties.

A first strategy is aimed from the manufacturing viewpoint at minimizing all factors capable of leading to power losses, especially by the use of precision techniques and suitable quality assurance measures over the entire fabrication process chain, so that the least possible rejects are produced during the manufacture of piezo bending transducers that meet defined power criteria. Since it is also necessary, in connection with quality assurance, to take into consideration that generic safety valves and their piezo bending transducers may also be used on occasion under extreme environmental conditions (e.g. at the edge of a target operating range to be appropriately specified) and that relaxation or aging effects manifested by different magnitudes may occur on occasion, depending on environmental conditions (e.g. depending on temperature and/or atmosphere), during continuous operation, a certain level of production rejects cannot be avoided at present, despite the most meticulous manufacturing methods.

A second strategy aims at individual equalization of fabrication-related and/or wear-related power restrictions by product-internal state diagnosis as well as preferably electrical compensation thereof, for example by equipping piezo bending transducers or the pilot stages containing the piezo bending transducers with additional sensor capabilities, as are known, for example from DE 10 2016 213 228 A2.

In general, it is possible to exhaust the technical power limits over a broad field of application with both above-mentioned strategies or a combination thereof.

The first strategy necessitates a high investment expense for fabrication and quality assurance techniques and processes, wherein production rejects that in some cases are not inconsiderable ultimately cannot be avoided despite the most meticulous production techniques, especially when—as is regularly the case for generic safety valves—a high level of failure safety is to be assured.

In contrast, in the second strategy, the product-related expense for manufacturing costs is considerably increased, since the use of additional sensor capabilities, data storage or even evaluating devices in the pilot stages of generic safety valves is required for this purpose. Thus a diametrical conflict often arises with the product approach of solutions that are minimalized and reduced to what is absolutely necessary.

Against this background, it is an object of the present invention to improve a generic safety valve of the type mentioned in the introduction and that can be used as universally as possible, to the effect that its reliability in operation is enhanced by a safety function that is relatively simple to implement.

SUMMARY

This object is achieved with a safety valve according to the claims. This may be characterized, besides the features mentioned in the introduction, in that the control unit is set up for performance, to be repeated iteratively in fully automatic manner and after expiration of specified time intervals, of a function test of the electrofluidic pilot stage, wherein a change in the position of the piezo bending transducer is induced during the function test by suitable variation of the control voltage, which change is so transient and/or so small that, on the one hand, the correct functioning of the piezo bending transducer can indeed be checked by simultaneously occurring determination of an actually occurring deflection movement thereof, but on the other hand the flow of the primary working fluid flow through the main stage is not influenced in any way.

With the present embodiments, it is possible to use, in an inventive safety valve, even for safety-critical applications, such piezo bending transducers that would have been regarded heretofore as rejects due to slight deviations from the standard parameters desired from the manufacturing viewpoint, since they were at the edge of the product properties to be guaranteed for assurance of continuous operation. This is so because an inventive safety valve is always able to guarantee, on the basis of the function tests implemented according to the invention, that the piezo bending transducer, which functions as an actor of the pilot stage, either functions correctly, or that a functional disorder, which may exist or be imminent, is recognized by the piezo bending transducer, whereupon appropriate countermeasures can be taken (e.g. replacement of the pilot stage of an inventive safety valve or of the safety valve as a whole).

Should relevant deviations from the target functioning of the piezo bending transducer occur in one or more of the function tests, which deviations may even consist in particular, for example, in an insidious change/deterioration of the functional capability of the piezo bending transducer, the operating personnel can be alerted by an alarm or fault signal to be appropriately emitted that correct functioning of the safety valve no longer exists or possibly will soon cease to exist. Furthermore, by suitable data storage of the measured results of the iteratively performed function tests, it may also be documented if necessary that the pilot stage of the safety valve or of the piezo bending transducer incorporated therein is still in flawless condition.

Inasmuch as it is mentioned in the foregoing that a statement about the correct functioning of the piezo bending transducer is made during the function tests to be repeated according to the invention, a check for this purpose is undertaken, especially by suitable measurement, as to whether the deflection movement of the piezo bending transducer to be expected by variation of the control voltage lies within a specified standard range. A measurement of the real movement behavior or of an actually occurring deflection movement of the piezo bending transducer can be achieved within the scope of the present invention, as will be explained in still more detail hereinafter, in a particularly preferred way by means of the sensor properties naturally present in the piezoelectrically active material, without additional sensor capabilities in the pilot stage containing the piezo bending transducer, and this is very advantageous from the manufacturing viewpoint.

In principle, it is also to be mentioned in connection with the present invention, that implementation of function tests to be repeated iteratively in safety valves is inherently already known. However, as in the prior art according to WO 01/59346 A1, WO 2008/005967 A2 or WO 2016/149590 A1, for example, these are usually so-called "Partial Stroke Tests", with which the functionality of the safety valve as a whole is always checked by influencing the primary working fluid flow. Furthermore, a continuous flow machine with several process control elements functioning as actuators is already known from WO 2008/000459 A1, wherein the functioning of a first process control element is checked without influence on the downstream process variable, by adjusting both process control elements to act in mutually opposite senses during the function test, to the effect that the influences of the adjustments on the downstream process variable are substantially canceled out, which would not be possible in a safety valve of the type claimed at present having only one piezo bending transducer functioning as actuator.

In a first advantageous alternative embodiment of the invention, it may be provided in particular that, by suitable specification of the volume of the control chamber, of the existing pressure ratios and/or of the energy needed for its actuation, the influencing device of the fluid-mechanical main stage is actuated by the secondary control fluid flowing into the control chamber only with a time delay of such magnitude—by transient disconnection of the control voltage—that the piezo bending transducer can be moved during the function test from its working position to its safety position and back again, without resulting in an influence on the flow of the primary working fluid flow through the main stage.

In other words, embodiments of the inventive safety valve may therefore be constructed advantageously in such a way that the respective switching or reaction times of the pilot stage and main stage are dimensioned such that the piezo bending transducer can be (completely) switched so rapidly from its working position to its safety position and back again during a function test that the time interval needed for the purpose is shorter than the specified time delay of the main stage, so that the main stage or its influencing device is not actuated by the transient change of switched position of the piezo bending transducer and consequently no influence is exerted on the primary flow through the safety valve.

In a second alternative embodiment, it may be provided that the piezo bending transducer is deflected only slightly from its working position during the function test by suitably reducing the control voltage, and specifically in such a way in particular that the resulting influence on the pressure in the control chamber of the main stage remains so small that no actuation of the influencing device of the main stage occurs to influence the flow of the primary working fluid, even if the time delay of the main stage is reached or exceeded. In this way it is possible, with simultaneously occurring acquisition of the actual deflection movement of the piezo bending transducer, to arrive at the conclusion needed during the function test concerning the correct functioning of the piezo bending transducer or of the pilot stage, without actuating the main stage or its influencing device in the process.

In principle, it is still to be remarked about the present invention that an inventive safety valve may have greatly varying and different complexity in its specific configuration, depending on the respective customer requirement.

It is so constructed in principle that it permits separation of media between the secondary control fluid flow and the primary working fluid flow. Hereby it is ensured that primary and secondary fluid do not need to be identical either in type, passing flow or pressure. By suitable design, primary fluid flows having greatly different energies can be controlled in this way via the secondary control fluid flow, which is preferably optimized with respect to energy.

The splitting of the fluidic actuating device into pilot and main stages permits, in a type of modular system, the combination of an identically configured electronic control unit and an identical pilot stage (equipped with a piezo bending transducer) with a main stage, which can be selected appropriately for the specific application, especially in view of the basic functionality of a working valve functioning as the influencing device for the main stage. Due to the flexible system configuration with a normally open (NO) or else a normally closed (NC) influencing device of the main stage, a defined safety response can be impressed on the overall design (in cooperation with the specified working and safety positions of the piezo bending transducer) in the event of failure of the electrical or fluidic energy carrier. This is decisive in particular for use in safety-relevant applications, which in the fault situation must occupy a defined safe state without additional auxiliary energy.

As in the prior art, therefore, inventive safety valves may be used in normal operation as continuously actuated changeover valves, which in the safety situation return to the desired safety position. With the present invention, the safety characteristics of such valves are durably improved. This is achieved in particular in that the function tests implemented according to the invention can be performed on the actuated safety valve during operation, wherein neither process impairment nor temporary deactivation of the safety device takes place during each of the iterative function tests.

During use of the described two-stage valve design comprising a pilot stage having the piezo bending transducer (with preferably short switching time) in combination with the downstream main stage (with switching delay), it is possible, by suitable design of the volume/pressure ratio associating the two stages, to generate a stable time-dependent transition range, in which transient fluctuations of the control flow actuating the piezo bending transducer remain without effect on the main stage or on the primary fluid flow influenced thereby.

The maximum time interval of the time-dependent transition range usable for diagnostic purposes during the function tests is calculated from the duration of the changeover process of the pilot stage to be undertaken during the function test and the time delay with which the downstream working stage follows a change of the input signal. This transition range forms the direct relationship between the delivered secondary control fluid flow, the dead space of the control chamber of the main stage and the necessary actuation energy for manipulation of the influencing device of the main stage. The two last-mentioned characteristics are in turn related to the fluidic transmission ratio between the separated primary and secondary fluid flows. As a general relationship, it follows that the time-dependent transition range also increases with increasing fluidic transmission ratio, and this can be taken into appropriate consideration within the scope of the present invention.

Within the scope of the present invention, it is particularly preferably possible to provide a modular design of the safety valve, in which the electronic control unit, the electrofluidic pilot stage and/or the fluid-mechanical main stage are respectively constructed as separate modules. Then it is merely necessary to contact the control unit in appropriate electrical manner with the pilot stage or with the piezo bending transducer contained therein and to provide a suitable fluid path for the secondary control fluid to be carried from the pilot stage to the control chamber of the main stage. Each of these modules preferably has its own housing, which housings are disposed preferably adjacent to one another during assembly of the inventive safety valve. The fluid path to the fluid-carrying connection of the pilot stage with the main stage may then be formed advantageously by means of housing openings corresponding to one another.

Furthermore, it proves to be particularly advantageous when the electrofluidic pilot stage contains no electrical and/or electronic components other than the electrical conductors necessary to supply the piezo bending transducer with the control voltage, wherewith especially the unit costs of inventive safety valves can be kept within reasonable limits.

Furthermore, it may be provided in a preferred configuration of the present invention that the control unit is set up to modulate, onto the piezo bending transducer for diagnostic purposes during the function test, via the conductors that also carry the control voltage, an evaluable electrical measurement signal, especially an a.c. voltage with suitable amplitude. In this case it may then be further provided advantageously that the control unit is set up for acquisition and evaluation of a response signal induced by the measurement signal, in order that a deflection movement of the piezo bending transducer that has actually occurred can be determined.

This measurement signal may advantageously be an a.c. voltage, so that, by evaluation of the phase shift between the measurement signal and the alternating current induced thereby as a response signal, a change of impedance of the piezo bending transducer can be determined that corresponds to an actual deflection movement of the piezo bending transducer.

Preferred configurations of the present invention are based on the following considerations: A piezo bending transducer changes its impedance upon moving away from or approaching a mechanical contact point compared with freely movable intermediate positions. For diagnostic purposes, therefore, an a.c. voltage lying—especially in its amplitude—(far) below the threshold voltage necessary for deflection of the piezo bending transducer may be modulated onto the piezo bending transducer, and simultaneously the d.c. voltage signal (control voltage) may be reduced. The change of the phase shift between the profile of the a.c. voltage and the alternating current induced thereby then permits the definitive detection of a deflection that has really occurred at the piezo bending transducer in a particularly simple manner and without needing additional sensor capabilities for the purpose in the pilot stage, or in this way it permits a statement concerning the time at which the piezo bending transducer occupies or leaves the working position and/or the safety position (typically defined by stops).

After the (transient) reduction or disconnection of the control voltage and before reaching the critical time delay of the influencing device of the main stage, the pilot valve forming the pilot stage is then impressed again with the control voltage necessary for occupying the working position, and the safety valve is thus reset to target mode of operation without feedback to the main stage or to the primary working fluid flow influenced hereby.

Within the scope of the present embodiments, however, it is obviously also possible to resort to other measurement techniques for determination of a deflection movement of the piezo bending transducer that has actually occurred, wherein a measurement of the capacitance and/or of a change of the resonance behavior of the piezo bending transducer in particular is also conceivable, which likewise is possible without the assistance of additional sensor elements in the pilot stage. Obviously it would also be possible in principle to evaluate other electrically measurable influencing variables that change as a function of position in order to determine an actual deflection movement of the piezo bending transducer in simple manner.

In yet another preferred further development of the present invention, it may be provided that the control unit is further set up to determine the length of the time interval between two function tests in dependence on a rating representing the quality of the piezo bending transducer, which rating in turn is resident in a memory unit preferably assigned to the control unit (and thus preferably disposed inside the control unit).

This rating may be, for example, a measured value, determined during quality control or during a calibration process, of the quality of the piezo bending transducer in question, so that, for example, longer time intervals can be specified between two successive function tests for a high-quality bending transducer, as can, in contrast, shorter time intervals between each two function tests for a poorer-quality bending transducer. Within the scope of the present invention, typical time intervals between two function tests may otherwise advantageously lie in the range between 8 hours and 72 hours.

Furthermore, it is then of advantage when the control unit is set up to dynamically adapt the rating (and the resulting length of the time interval between two function tests) in dependence on measured values of previous function tests.

Thus, for example, the time interval between two function tests may be shortened when it is found in one or more previously performed function tests that the control voltage necessary for holding the piezo bending transducer in the working position has increased or—which means the same thing—that a smaller reduction of the control voltage, starting from the working position, is already sufficient for the piezo bending transducer to move from the working position in the direction of the safety position, or else this movement can be induced only after larger reduction of the control voltage. Such behavior can obviously be attributed to deterioration of the quality of the piezo bending transducer.

Furthermore, it may also be provided particularly expediently that the control unit is set up to dynamically adapt the control voltage needed for actuation of the piezo bending transducer in dependence on measured values of previous function tests (and/or in dependence on the rating).

This may also be utilized in particular for reduction of the operating load of the piezo bending transducer, which is typically operated in continuous service, in that, for high-quality piezo bending transducers, for which a low control voltage is already sufficient for a maximum deflection, the control voltage provided for holding the deflected working position is systematically reduced to the respective minimum voltage that is currently needed.

Furthermore, it proves to be particularly advantageous when the piezo bending transducer is configured by choice of a suitable geometry and suitable materials in such a way that the electrical capacitance of the piezo bending transducer over a permissible operating temperature range of −40° C. to +80° C. is always smaller than 170 nF, preferably smaller than 100 nF. Moreover, it is of advantage when the electrofluidic pilot stage according to DIN EN 60079-11 is equipped for use in potentially explosive atmospheres, preferably as a unit constructed to be intrinsically safe.

With appropriate limitation of the maximum capacitance of the piezo bending transducer to a value lying below the explosion-critical limits, the electrofluidic pilot stage may be used without additional measures as a product that is intrinsically safe over the entire operating temperature range typical of industry, even in potentially explosive environments. By consistent compliance with the explosion guideline mentioned in the foregoing (e.g. suitable clearance and creepage distances for the electrical conductors, etc.) and the avoidance of any other energy-converting electronics or sensor capabilities integrated into the electrofluidic pilot stage, the intrinsic safety of the pilot valve can be guaranteed without additional expense, independently of the application situation. The electrical interfacing of the electrofluidic pilot stage with the electronic control unit (advantageously equipped as a separate module with its own housing), which likewise may be designed in accordance with explosion protection guidelines, is accomplished particularly simply by means of two-conductor technology, wherein the electrical connection may preferably be assured by means of plug contacts with sufficiently large conductor-track spacings.

To fulfill the explosion protection guidelines, the piezo bending transducer may in particular be configured from the viewpoint of geometry and material that it never stores more than 50 μJ of electrical energy over a temperature range of −40° C. to +80° C. With specification of a maximum permissible electrical driving voltage of 24 VDC, this may be guaranteed, as already mentioned in the foregoing as a particularly preferred configuration, in that the bending transducer capacitance C respects a maximum value of 170 nF in every operating condition.

Furthermore, it may even be preferably provided within the scope of the present invention that the control unit has an interface for communication with higher-level control, regulation, diagnostic and/or communications devices and systems (suitable standards) and is set up for active or passive transmission of data determined during the iterative function test.

The control unit of the safety valve and/or the higher-level control, regulation or diagnostic system may also be set up in particular to issue a fully automatic request for the performance of preventive service or repair measures in dependence on measured values of the performed function tests and upon reaching warning thresholds that can be specified in this respect, especially if the rating is successively deteriorating.

Further aspects and further developments that can be advantageously considered within the scope of the present invention, especially in connection with the piezo bending transducers to be used, are also apparent from the following remarks:

Piezo bending transducers in which the piezoelectrically active material is disposed in frictionally bonded manner both on the top side and on the underside of the piezoelectrically inactive carrier layer in respectively at least one layered coating prove to be particularly high-performing. Particularly advantageously, the piezoelectric material is selected in such a way that the geometric change of the at least one layer on the top side changes in a manner exactly opposite to the geometric change on the underside when subjected to simultaneously electrical excitation. A simultaneously initiated expansion of the piezoelectrically active layer on the one as well as contraction of the inactive carrier layer on the opposite layer additionally intensifies the bowing effect of the bending transducer.

For the flat-structured piezoelectrically inactive carrier layer, the choice of a ceramic material related to the piezoelectrically active material from the viewpoint of type and having comparable thermal behavior proves to be particularly advantageous. Such materials compete with resin-impregnated materials stiffened by fiber reinforcement, wherein the stiffness can be influenced anisotropically in dependence on the selected fiber orientation and geometric configuration, which may likewise be advantageous. The use of layers of electrically conductive, fiber-reinforced materials and/or resin systems, which simultaneously permit electrical contacting with the layer of piezoelectrically active material associated with the fiber composite, also proves to be particularly advantageous. Via their integrated resin system, they achieve reliable tolerance compensation for slight geometric thickness deviations of the piezoelectrically active materials associated with them and guarantee a secure frictional bond.

On the basis of their layered structure comprising material having different physical properties, piezo bending transducers tend especially toward bimetallic-like behavior in terms of their thermal natural bending deformation. If this is not restricted reliably from the process viewpoint by suitable measures, such as assurance of suitable material homogeneity and thickness pairing, for example, the extent of the thermal natural bending deformation may significantly impair the range of desired piezoelectrically induced bowing. The selective application of suitable (thin-layer) compensating faces or structures of thermally differing compensating material has proved advantageous as a compensation measure that can be superposed subsequent to the bending transducer production process. By the application of such additional compensating faces or structures on the bending transducer to side or underside, a thermally induced bending torque can be impressed that counteracts the thermal natural bending deformation and compensates for it. The physical properties of this compensating face or structure are advantageously selected such that, on the one hand, they fulfill the described thermal compensating effect but, on the other hand, they influence the power-determining actuator characteristics (especially the no-load deflection and the blocking force) only minimally.

For optimal utilization of the actuator power applied in longitudinal direction of the piezo bending transducer, which usually has the form of a strip, this transducer is particularly advantageously clamped mechanically securely over its entire width close to a first geometric end of the strip. Its actuator movement and force needed for influencing the secondary control fluid flow is advantageously taken off close to the second, opposite end. Since the mechanical fixation prevents the clamping and take-off areas from contributing to the deflection, their longitudinal expansion is minimized. The mechanical clamping is therefore applied preferably over an area or line in the form of a flexurally stiff knife-edge bearing. Take-off of the actuator movement and force advantageously takes place over a line or even at a point. To avoid any power losses due to torsion, take-off advantageously takes place along the centerline of the bending transducer.

If an embodiment of an inventive safety valve with piezo bending transducer is to be used in a humid environment, the electrically active elements should be protected from humidity in order to prevent short circuits and corrosion. Advantageously, this is accomplished via applied surface layers such as moisture-protection varnish, for example, or by means of encapsulation by moisture-resistant film coatings. To prevent any force transmission losses, it is advantageous to cut away the moisture protection selectively in the clamping area in such a way that direct mechanical clamping without intermediate layer can be assured. In contrast, at the take-off area, it may be of advantage to combine the moisture protection with additional functional structures. In this way, selective contact faces with sealing properties, for example for valves, or anti-adhesion properties, for example at contact or damping elements, can be achieved with minimum detachment force.

Piezoelectric material tends to undergo electrical or mechanical relaxation within certain limits under continuous electrical or mechanical load. In this context, heat has an intensifying effect. Due to its time dependence, the absolute influence of relaxation effects decreases with duration of action of the causal characteristic variable. Due to relaxation, the piezoelectrically active material loses a certain proportion of the polarization or mechanical internal stress impressed on it during the fabrication process. Against this background, it is particularly advantageous to limit the electrical driving signal (i.e. the control voltage) to the voltage range necessary for the deflection, as was already explained hereinabove.

During assembly of the mechanical clamping, mechanical interfering influences should be advantageously minimized either via optimum orientation between clamping and take-off points or else a low-stress joining process with subsequent position correction should be provided by use of a suitable adjusting device.

For electrical excitation of the piezoelectrically active layers of a piezo bending transducer, it is necessary to expose them to an electric field, which advantageously is particularly homogeneous. For production of the electrode faces, the piezoelectric film material may be thinly metallized on both sides during the fabrication process for this purpose. After individual film elements have been cut out by means of suitable trimming processes, such as sawing, carving and breaking, for example, the piezoelectric film material may be excited electrically over the entire surface with a point contact to be provided on both sides. For symmetrically constructed bending transducers with a piezoelectrically active layer on each of the top side and underside as well as an electrically conductive support layer, the structural element can be contacted particularly easily. For this purpose, it is sufficient to connect the support layer as well as the outer electrode faces via one electrical point contact each.

For electrical excitation of piezoelectrically active layers, the application of an electrical control voltage is necessary on their electrode faces on both sides. This impresses a homogeneous electric field on the piezoelectrically active material disposed between them. The insulating properties of the piezoelectrically active material prevent any current conduction, whereby exclusively current flows for the process of charging or recharging the electrode faces.

The electrical capacitance of the piezo bending transducer is developed substantially from the number of piezoelectrically active elements involved, their electrode faces as well as the permittivity of the piezoelectrically active material. For minimization of the electrical relaxation, it is advantageous in piezoelectric bending transducers to initiate recharging processes via a short-cycle electrical exciting pulse with the same sign of the direction of change and to reduce, to a permissible extent, the holding voltage as well as the electric field initiated thereby via the piezoelectric material after the new target position has been reached, without thereby initiating a new change of position.

For optimal utilization of scale effects that are independent of application, it is particularly practical, on the basis of economic considerations, within the scope of design and manufacture of inventive safety valves, to standardize the electrofluidic interface consisting of electronic control unit and electrofluidic pilot stage with respect to its physical product properties in the essential features. From this, the following product properties, which are to be regarded as particularly advantageous in connection with implementation of the present invention, are obtained as the electrically actuated actuator for particularly energy-efficient applications:

Limitation of the maximum permissible electrical control voltage to 24 VDC, which is typical in industry Limitation of the electrical energy that can be stored in the piezo bending transducer to at most 50 µJ for intrinsically safe actuators. At a maximum voltage of 24 VDC, an advantageous electrical maximum capacitance of the piezo actuator of 170 nF is derived from this.

Specification of the working pressure for the secondary control fluid as 1.2 bar, on the basis of the common pneumatic unit signal Design of the interface for the standard service temperature range of the process industry of −40° C. to 80° C.

Besides the components already described in detail hereinabove, an inventive safety valve, which in particular may be of modular design, ultimately may still have a pressure-medium conditioning module, which takes over the application-related conditioning of the secondary control media flow. Besides a filter element, this may contain a forepressure regulator for overload protection of the prepared supply pressure in the secondary control fluid flow.

BRIEF DESCRIPTION OF THE DRAWING

An exemplary embodiment of an inventive safety valve or of the components that can be used therein will be explained in more detail hereinafter on the basis of the drawing, wherein.

DETAILED DESCRIPTION OF THE PREFERRED EMBODIMENTS

Figure 1:
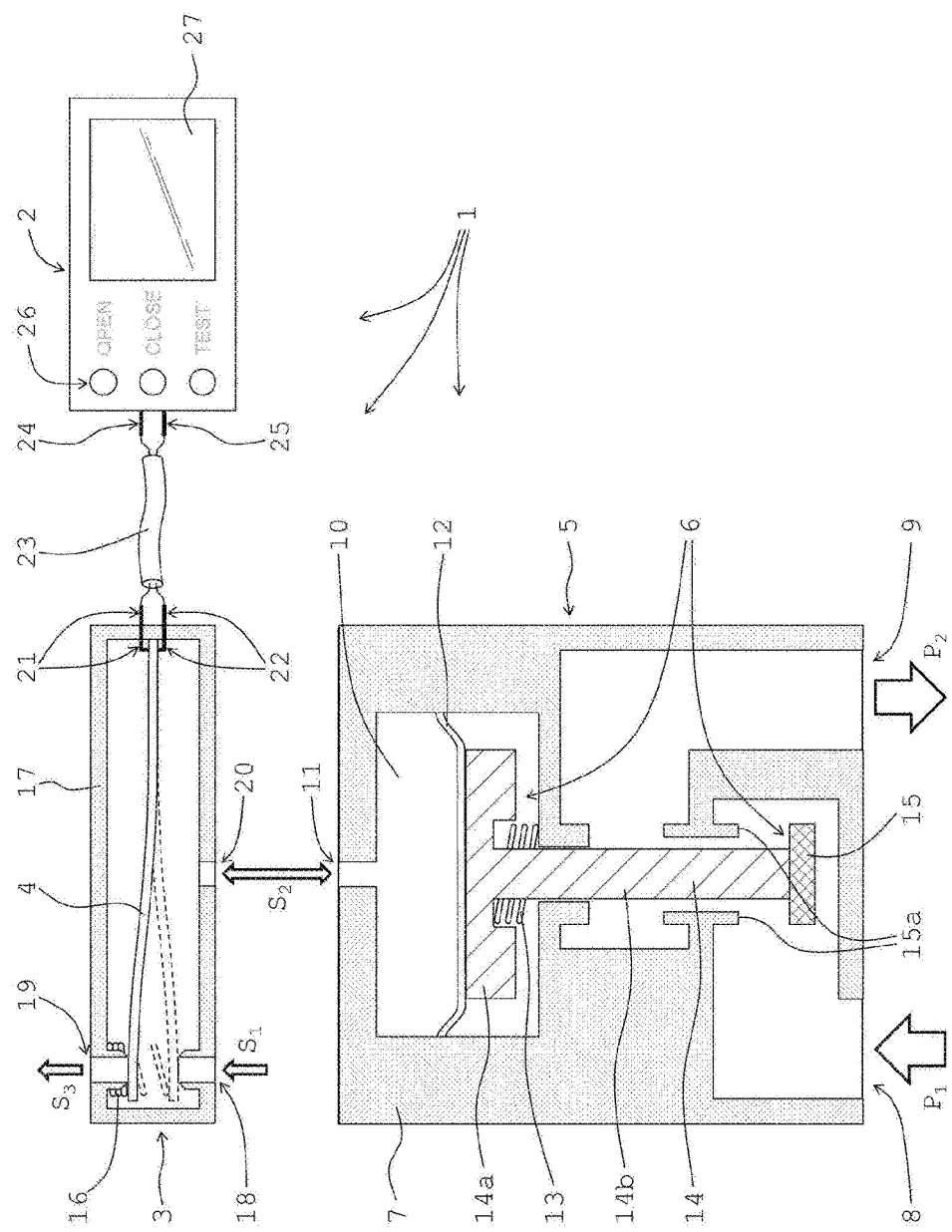
FIG. 1 shows a schematic diagram, partly in cross section, of all components of an exemplary embodiment of an inventive safety valve.

FIG. 1 shows an exemplary embodiment of an inventive safety valve 1 of modular design. This is provided with an electronic control unit 2 for generation of a control voltage, with an electrofluidic pilot stage 3 with a piezo bending transducer 4 that can be actuated between a working and a safety position by means of the control voltage and that influences the flow of a secondary control fluid flow in position-dependent manner as indicated by arrows $S_1$, $S_2$, $S_3$, and with a fluid-mechanical main stage 5 having an influencing device 6 for influencing the flow of a primary working fluid flow as indicated by arrows $P_1$, $P_2$.

Main stage 5 is constructed here as an NC variant (NC=normally closed) in actuated state. It comprises a housing 7, a fluidic inlet 8 and a fluidic outlet 9 for the primary working fluid flow, a control chamber 10 with port 11 for secondary fluid flow $S_2$, which is separated by a diaphragm 12, an actuating element 14 reset by means of a spring 13 (and which in the present case is deflected against the spring force), as well as a sealing element 15 fastened thereon, which with a seal seat 15a blocks the primary working fluid flow through main stage 5 when actuating element 14 is pushed upward. Longitudinally displaceable actuating element 14 consists of a diaphragm disk 14a connected to diaphragm 12 as well as a shaft 14b fastened thereon, which projects into the primary flow and on the free end of which sealing element 15 is fastened. The step-up ratio between pilot stage 3 and main stage 5 is determined essentially by the area ratio of diaphragm disk 14a to sealing element 15.

Pilot stage 3 is constructed as a piezo valve, wherein piezo bending transducer 4 is represented both in its actuated working state (with solid lines) and in its safety position (with dashed lines). Occupation of this safety position (when control voltage is not present) is forced by a spring 16, which preloads the piezo bending transducer in the direction of the safety position. Both elements (i.e. piezo bending transducer 4 and spring 16) are disposed in a housing 17 of pilot stage 3, which housing has a supply port 18 (for the secondary control fluid present under pressure), a venting port 19 as well as a port 20 for the secondary fluid flow carried to/from control chamber 10 of main stage 5, which port is to be connected appropriately with upper port 11 on housing 7 of main stage 5.

In the working position of piezo bending transducer 4, a fluid path exists between supply inlet 18 and outlet 20 of pilot stage 3 leading to main stage 5, while vent port 19 is covered or blocked by the free end of piezo bending transducer 4.

In contrast, in the safety position of piezo bending transducer 4 represented by dashed lines, supply inlet 18 is covered by the free end of piezo bending transducer 4, so that in this position a fluid path exists between port 20 a vent port 19, which leads to venting of control chamber 10 of the main stage, so that then influencing device 6 of main stage 5 is transferred by its spring preload into the end position, which blocks the primary working fluid flow.

Electrical conductors 21, 22 of the pilot stage needed for supplying piezo bending transducer 4 with the control voltage are brought out through housing 7, from where they are connected in standard manner—for example using suitable plugs—by means of a cable 23 to ports 24, 25 of control unit 2 corresponding thereto, wherein the simplest variant of a two-conductor connection is chosen for this purpose in the present exemplary embodiment.

Control unit 2, appropriately set up in standard manner for control of safety valve 1 and especially for generation of a control voltage, is illustrated only schematically. Besides the control electronics (not illustrated), which are set up in a way according to the invention to perform function tests, to be repeated iteratively, of pilot stage 3, it also comprises operator-control elements 26, a display element 27 and suitable ports or interfaces (not illustrated) for communication with higher-level control, regulation, diagnostic and/or communications devices and systems and for active or passive transmission of data determined during the iterative function tests. Furthermore, suitable signal inputs may be provided for any measurement signals that may be needed for control of the valve.

The connection to be appropriately established for the secondary control fluid flow between ports 20, 11 on pilot and main stages 3, 5 is illustrated by a double arrow. Influencing device 6 of main stage 5 can therefore be actuated by means of the secondary control fluid flow discharging into control chamber 10 of main stage 5, wherein the pressure present at supply port 18 of pilot stage 3 in the working position of piezo bending transducer 4 shown in FIG. 1 is delivered to control chamber 10 of main stage 5, whereby influencing device 6 of main stage 5 occupies, as illustrated, the switched state that releases the primary working fluid flow.

If piezo bending transducer 4 is now transferred into the safety position illustrated by dashed lines in FIG. 1 by disconnection or reduction of the control voltage by means of control unit 2, or if it is deflected in this direction, the pressure in control chamber 10 is lowered (due to opening of vent port 19), since the secondary control fluid present therein under pressure is able to flow back to pilot stage 3 and to escape through vent outlet 19 as shown by arrow $S_3$.

Control unit 2 of inventive safety valve 1 is set up for performance, to be repeated iteratively in fully automatic manner and after expiration of specified time intervals (of between 8 and 72 hours, for example), of a function test of electrofluidic pilot stage 3, wherein a change in the position of piezo bending transducer 4 is induced during the function test by suitable variation of the control voltage, which change is so transient and/or so small that, on the one hand, correct functioning of piezo bending transducer 4 can indeed be checked by simultaneously occurring determination of an actually occurring deflection movement thereof, but on the other hand the flow of the primary working fluid flow through main stage 5 is not influenced in any way.

Figure 2:
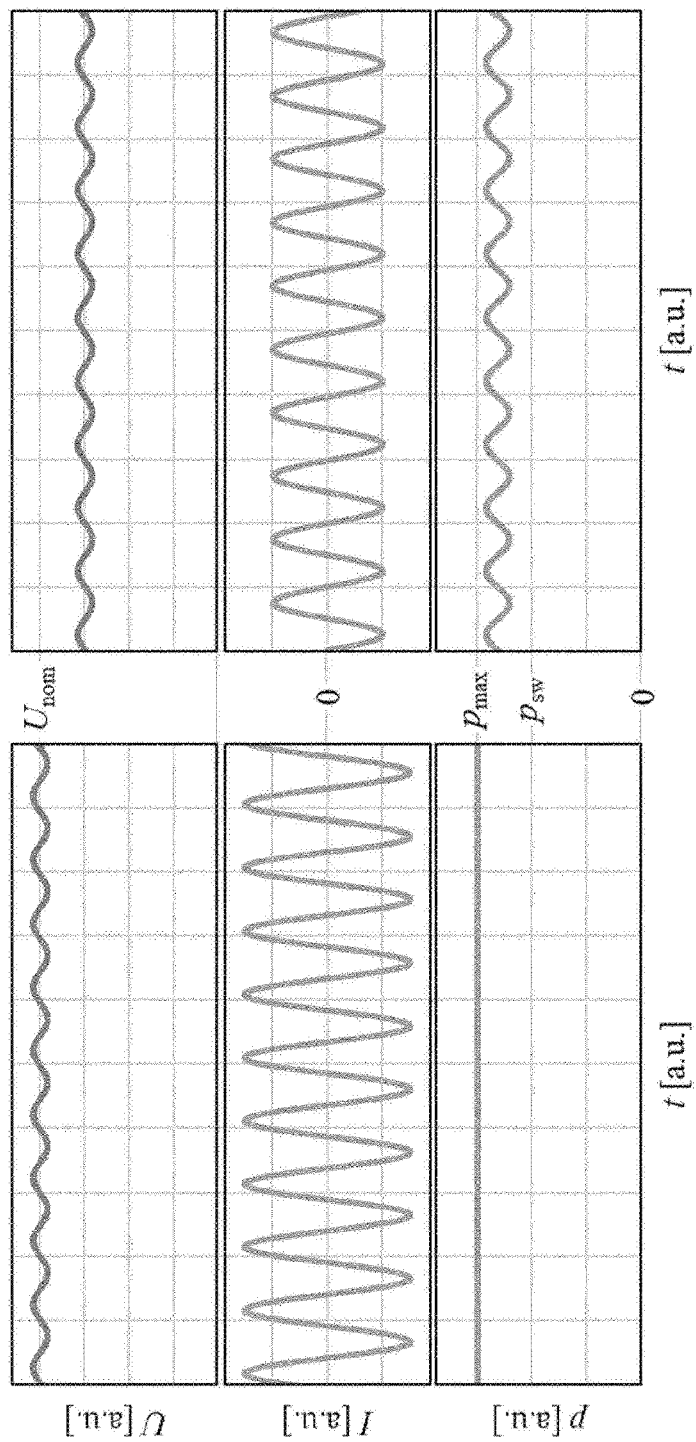
FIG. 2 shows typical signal and pressure variations during a function test realized according to the invention.

FIG. 2 shows, by way of example, the signal and pressure variations during a function test realized according to the invention, in which a measurement signal is modulated onto the control voltage and measured as a response signal of the (alternating) current induced hereby.

In these graphs, the left column shows the signal variations at nominal control voltage ($U_{nom}$), i.e. in working position.

The graphs in the right column show the respective signal variations at reduced control voltage, wherein piezo bending transducer 4 has already left its end position.

The graphs in the upper row respectively show the control voltage U, onto which an a.c. voltage of low amplitude is modulated as the measurement signal. The middle row shows the current signal I measured respectively as the response signal and the lower row shows the pressure p obtained at outlet 20 (which leads to control chamber 10 of main stage 5) of pilot stage 3.

In the sketched situation, the modulated voltage has a frequency that lies close to and slightly above the resonance frequency of piezo bending transducer 4 in its end position.

In working position, the pressure at outlet 20 of pilot stage 3 is constant. A small positive phase shift is established between voltage and current.

If the driving voltage is now lowered, piezo bending transducer 4 leaves its end position and the pressure decreases slightly, wherein, during the function test realized according to the invention, it is ensured by suitable specification of the volume of control chamber 10, of the given pressure conditions and/or of the energy needed for actuation of influencing device 6 of main stage 5 (and which is also determined, for example, by the restoring force of spring 13 of main stage 5), that the pressure at each time is above the switching pressure ($p_{sw}$) necessary for actuation of influencing device 6 of main stage 5. Hereby it is therefore possible to realize a function test of the pilot stage without exerting an influence on the primary working fluid flow at the same time.

Due to the departure from the end position, a change of the phase position and amplitude results in the response signal, so that, in the case of the existence of a phase shift between the measurement signal modulated onto the supply voltage and the response signal (measured as the current flow), which deviates from the phase shift occurring in working position, it is possible to infer the actual deflection of the piezo bending transducer from its end position and thus its correct functioning. In the illustrated example, the phase shift between current and voltage now amounts to −180° (see the signal variations illustrated in the upper two graphs in the right column of FIG. 2).

Figure 3:
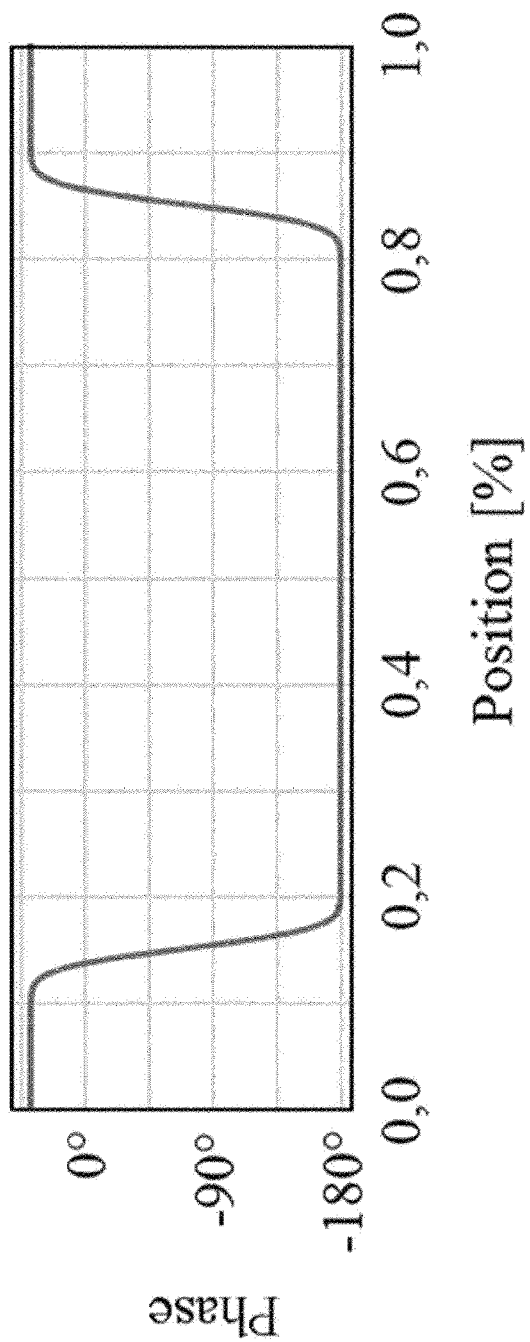
FIG. 3 shows a diagram of the variation of a phase shift between input and response signal as a function of the position of the piezo bending transducer.

Finally, FIG. 3 shows, for the given exemplary embodiment, the variation of the phase shift as a function of the (relative) position/deflection of piezo bending transducer 4 from its working position, wherein a value of 1 corresponds to transfer of the piezo bending transducer into its safety position.

The graph illustrated in FIG. 3 is most largely self explanatory together with the explanations about FIG. 2. In this connection, the exact variation of the phase shift depends on the frequency of the modulated signal. Once again, a case is sketched that relates to a frequency close to and slightly above the resonance frequency of the piezo bending transducer in the end position.

What is claimed is:

1. A safety valve (1) comprising:
   an electronic control unit (2) for generation of a control voltage, an electrofluidic pilot stage (3), which has a piezo bending transducer (4) that can be actuated by means of the control voltage between a working and a safety position and that influences the flow of a secondary control fluid flow in position-dependent manner, and a fluid-mechanical main stage (5) having an influencing device (6) for influencing the flow of a primary working fluid flow, wherein the influencing device (6) can be actuated by means of the secondary control fluid flow discharging into a control chamber (10) of the fluid-mechanical main stage (5), wherein the electronic control unit (2) is configured to repeat iteratively after expiration of a specified time interval, a function test of the electrofluidic pilot stage (3), the function test comprising first varying the control voltage following the specified time interval thereby effecting a change in position of the piezo bending transducer, which change is sufficiently transient or small such that the change in position of the piezo bending transducer does not influence the primary working fluid flow through the main stage in any way, and following the varying of the control voltage, determining that the piezo has deflected.

2. The safety valve (1) of claim 1, wherein, a volume of the control chamber (10) and existing pressure ratios or energy needed for actuation of the influencing device are selected such that the influencing device (6) of the fluid-mechanical main stage (5) is actuated by the secondary control fluid flowing into the control chamber only with a time delay of such magnitude that the piezo bending transducer (4) can be moved during the function test, by transient disconnection of the control voltage, from its working position to its safety position and back again, without resulting in an influence on the flow of the primary working fluid flow through the fluid-mechanical main stage (5).

3. The safety valve (1) of claim 1, wherein the piezo bending transducer (4) is deflected from its working position only partially during the function test by the varying of the control voltage, such that the piezo bending transducer does not move to its safety position.

4. The safety valve of claim 1, wherein the electronic control unit (2), the electrofluidic pilot stage (3) and/or the fluid-mechanical main stage (5) are respectively constructed as separate modules.

5. The safety valve of claim 1, wherein the electrofluidic pilot stage (3) contains no electrical and/or electronic components other than electrical conductors (21, 22) for supplying the piezo bending transducer (4) with the control voltage.

6. The safety valve (1) of claim 5, wherein the electrical conductors connect the electrofluidic pilot stage to the electronic control unit (2), and wherein the electrical conductors carry the control voltage from the electronic control unit to the electrofluidic pilot stage and wherein the electronic control unit further modulates an evaluable electrical measurement signal onto the piezo bending transducer (4) for diagnostic purposes during the function test by way of the electrical conductors.

7. The safety valve (1) of claim 6, wherein the electronic control unit (2) acquires and evaluates a response signal induced by the measurement signal, in order that a deflection movement of the piezo bending transducer (4) that has actually occurred can be determined.

8. The safety valve (1) of claim 6, wherein the measurement signal is an a.c. voltage and in that, by evaluation of the phase shift between the measurement signal and the alternating current induced thereby as a response signal, a change of impedance of the piezo bending transducer (4) can be determined that corresponds to an actual deflection movement of the piezo bending transducer (4).

9. The safety valve (1) of claim 1, wherein the electronic control unit (2) determine, by measurement of capacitance or of a change of the resonance behavior of the piezo bending transducer (4), a deflection movement of the piezo bending transducer (4) that has actually occurred.

10. The safety valve (1) of claim 1, wherein the electronic control unit (2) defines a length of the specified time interval between two function tests based on a rating representing a characteristic of the piezo bending transducer (4), which rating is retrieved from a memory unit assigned to the electronic control unit (2).

11. The safety valve (1) of claim 10, wherein the electronic control unit (2) dynamically adapts the rating and the resulting length of the time interval between two function tests based on measured values of previous function tests.

12. The safety valve (1) of claim 1, wherein the electronic control unit (2) dynamically adapts the control voltage needed for actuation of the piezo bending transducer (4) based on measured values of previous function tests.

13. The safety valve (1) of claim 1, wherein the piezo bending transducer (4) has an electrical capacitance over a permissible operating temperature range of −40° C. to +80° C. is always smaller than 170 nF.

14. The safety valve (1) according to claim 1 wherein the electrofluidic pilot stage (2) is equipped for use in potentially explosive atmospheres.

15. The safety valve (1) of claim 1, wherein the electronic control unit (2) has an interface for communication with higher-level control, regulation, diagnostic and/or communications devices and systems transmits data determined during the iterative function test by way of the interface.

* * * * *